United States Patent [19]
Hopkins

[11] Patent Number: 5,898,329
[45] Date of Patent: Apr. 27, 1999

[54] PROGRAMMABLE PULSE WIDTH MODULATION CIRCUIT

[75] Inventor: Thomas L. Hopkins, Mundelein Lake, Ill.

[73] Assignee: STMicroelectronics, Inc., Carrollton, Tex.

[21] Appl. No.: 08/775,612

[22] Filed: Dec. 31, 1996

[51] Int. Cl.[6] .................................................. H03K 7/08
[52] U.S. Cl. ........................................ 327/176; 327/295
[58] Field of Search ........................... 327/115, 160, 327/172, 175, 176, 216, 291, 293, 295, 297, 415, 416, 31, 38, 141, 142, 151, 319

[56] References Cited

U.S. PATENT DOCUMENTS

| | | | |
|---|---|---|---|
| 4,291,241 | 9/1981 | Mayama et al. | 327/216 |
| 5,365,183 | 11/1994 | Mitsuhira | 327/295 |
| 5,483,540 | 1/1996 | Okamura | 327/295 |
| 5,631,592 | 5/1997 | Schwarz et al. | 327/291 |
| 5,689,690 | 11/1997 | Lesmeister et al. | 327/291 |

*Primary Examiner*—My-Trang Nu Ton
*Attorney, Agent, or Firm*—Theodore E. Galanthay; Lisa K. Jorgenson; Peter J. Thoma

[57] ABSTRACT

A circuit for producing multiple pulse width modulated outputs. The circuit includes a logic device for each pulse width modulated output. Each of the logic devices includes a first input, a second input, and a clock input, and each of logic device produces a logical high output in response to a logical high at its first input in coincidence with a clock signal at its clock input. The logical high output of the logic device remains high until a logical high is applied at its second input in coincidence with a clock signal at the clock input, whereupon the logic device produces a logical low output. The logical low output of the logic device remains low until a logical high is again applied at its first input in coincidence with a clock signal at the clock input. The circuit includes programmable circuitry for selectively applying logical high and low signals to the first and second inputs of the logic devices.

16 Claims, 3 Drawing Sheets

PROGRAMMABLE PULSE WIDTH MODULATION CIRCUIT

FIELD OF THE INVENTION

The present invention relates generally to control circuitry, and more particularly to a circuit for producing multiple pulse width modulated outputs, wherein the outputs are synchronized in frequency and programmable in duty cycle and phase shift.

DESCRIPTION OF THE PRIOR ART

In applications where there are multiple outputs on a switching regulator, it is possible that noise generated by switching one output can adversely affect the regulation of other outputs in the system. To avoid this, multiple output regulators typically are synchronized to a single frequency so that they all switch on the same frequency and typically at the same time. In some applications, the switching frequency is synchronized to an external signal, for example the horizontal of a CRT sweep, so that generated noise does not adversely affect the application.

When a device is switched on or off, the voltage transient generated across the lead inductance is related to the rate of change of current during switching by the equation V=L di/dt. When building a regulator that has multiple outputs, for example four, if all of the outputs switch on at the same time, the total voltage transient generated across the lead inductance is related to the sum of the peak currents during switching. Thus, if four 8 amp regulators are switched on and off together, a current change of 32 amps is realized over a short time and substantial noise is generated during switching. If the multiple outputs could be synchronized so that they each switched on and off at a different time, then the peak voltage transient would be reduced to that caused by the worst case change in current in one of the multiple outputs. This would then reduce the total noise in the system and spread it across time in each cycle.

It is therefore an object of the present invention to provide a synchronization circuit for switching regulators and the like that produces outputs that are synchronized in frequency, but programmable in duty cycle and phase shift.

SUMMARY OF THE INVENTION

Briefly stated, the present invention provides a synchronization circuit for producing multiple pulse width modulated outputs. The circuit produces pulse width modulated outputs that are synchronized in frequency and it is programmable such that the outputs have independent user selectable duty cycles and phase shifts.

The circuit includes a logic device for each pulse width modulated output. Each of the logic devices includes a first input, a second input, and a clock input, and each of logic device produces a logical high output in response to a logical high at its first input in coincidence with a clock signal at its clock input. The logical high output of the logic device remains high until a logical high is applied at its second input in coincidence with a clock signal at the clock input, whereupon the logic device produces a logical low output. The logical low output of the logic device remains low until a logical high is again applied at its first input in coincidence with a clock signal at the clock input. The circuit includes programmable circuitry for selectively applying logical high and low signals to the first and second inputs of the logic devices.

In one embodiment of the present invention, the programmable circuitry for selectively applying logical high and low signals to the inputs of the logic devices includes a counter for counting clock signals and outputting a count value. A first digital comparator is associated with each first input of each logic device and a second digital comparator is associated with each second input of each logic device. The first and second digital comparators are connected to receive count values from the counter. A first compare register is associated with each of the first digital comparators, and a second compare register is associated with each of the second digital comparators. Each of the first and second compare registers holds a programmable value. Whenever a count value produced by the counter equals a value held in a compare register, the digital comparator associated with that compare register produces a logical high output.

The synchronization circuit may also include a third digital comparator having an output connected to a reset input of the counter. The third digital comparator is connected to receive count values from the counter. A third compare register that holds a programmable value is associated with the third digital comparator. Whenever a count value produced by the counter equals the value held in the third compare register, the third digital comparator produces a logical high output to reset said counter.

In alternative embodiments of the present invention, the programmable circuitry for selectively applying logical high and low signals to the first and second inputs of the logic devices includes a counter having a clock input and a plurality of counter outputs. The counter produces, sequentially for each clock signal, a logical high value at a single one of the counter outputs and a logical low value at each of the rest of the counter outputs. Circuitry is provided for selectively connecting one counter output to each of the first and second inputs of the logic device.

In one of the alternative embodiments, the counter outputs are connected to the first and second inputs of the logic device by means of first and second multiplexer associated with each of the logic devices. Each of the multiplexer includes a plurality of inputs connected to the counter outputs and a single input connected to an input of the logic device associated therewith. The outputs of the first multiplexers are connected to the first inputs of the logic devices, and the outputs of the second multiplexers are connected to the second inputs of the logic devices. A select register is associated with each of the first and second multiplexers. Each of the select registers is programmable to connect a selected input of the multiplexer associated therewith to the output of the multiplexer associated therewith.

In a second alternative embodiment, the counter outputs are connected to the first and second inputs of the logic device by means of a programmable logic array. The programmable logic array includes a plurality of inputs connected to the counter outputs and plurality of outputs connected to the first and second inputs of the logic devices.

In a third alternative embodiment, the programmable circuitry for selectively applying logical high and low signals to the inputs of the logic devices includes a counter for counting clock signals and outputting a count value and the complement of the count value. The counter outputs and their complements are connected to a programmable logic array. The first and second inputs of the logic devices are connected to the programmable logic array. The programmable logic array is programmed to produce a single high output in response to receiving particular eight bit numbers at its inputs.

DESCRIPTION OF THE PREFERRED EMBODIMENT

Figure 1:
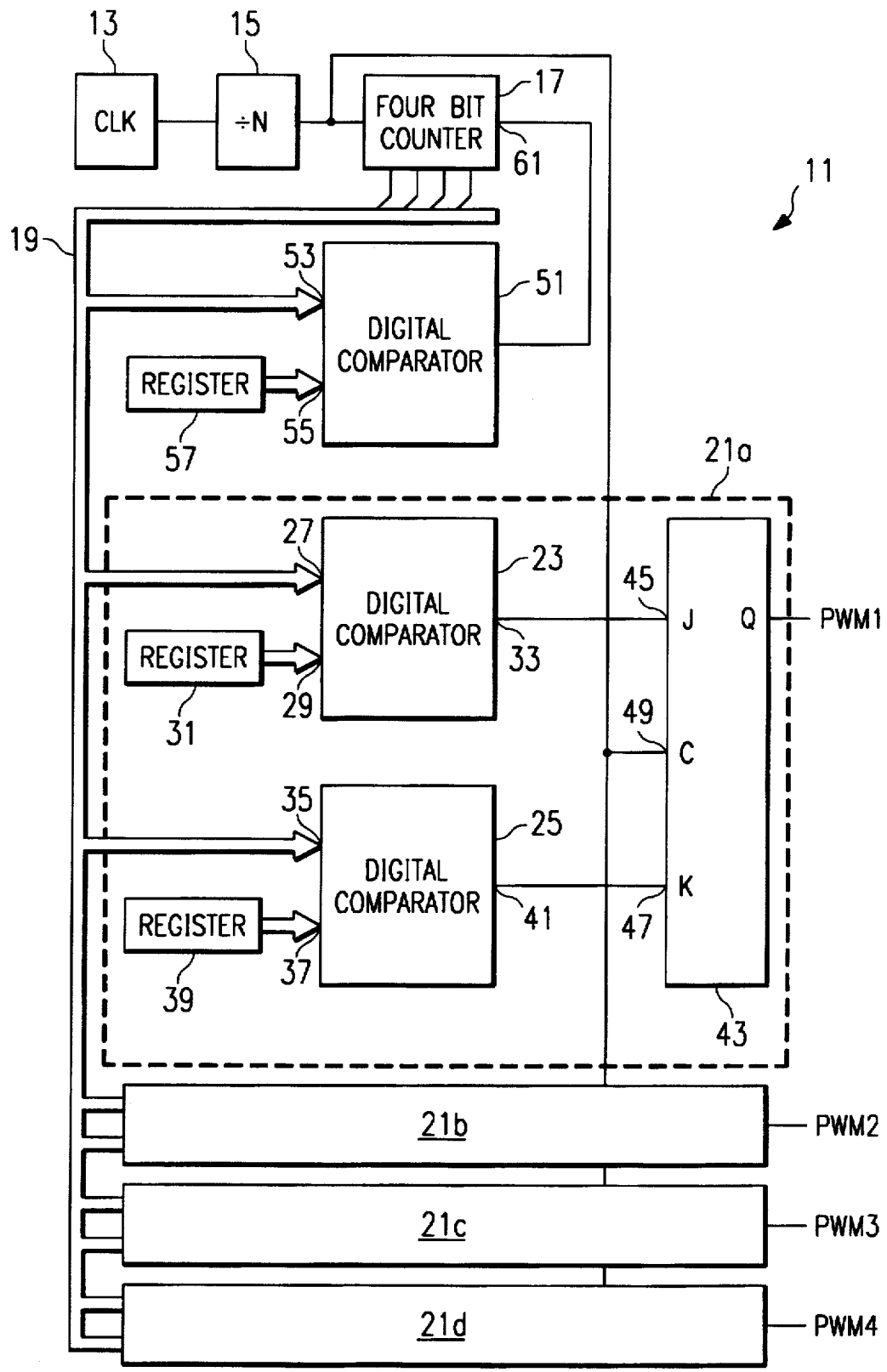
FIG. 1 is a block diagram of a preferred embodiment of the synchronization circuit of the present invention.

Referring now to the drawings, and first to FIG. 1, the synchronization of the circuit is designated generally by the numeral 11. In the embodiment illustrated in FIG. 1, synchronization circuit 11 is adapted to produce four pulse width modulated outputs. Those skilled in the art will recognize that the synchronization circuit of the present invention can be adapted to produce more or fewer outputs, as desired by the designer of the circuit.

The input to circuit 11 is a clock signal 13. Circuit 11 includes a programmable divider 15 that produces a desired circuit clock signal. The output of divider 15 is connected to a four bit counter 17. Four bit counter 17 has four outputs that are connected to a four wire bus 19.

The frequency of circuit 11 is determined by the frequency of clock signal 13, the divisor of divider 15, and the size of counter 17. For example, the frequency of clock signal 13 may be four MHz and the desired frequency of circuit 11 may be twenty-five KHz. Since four bit counter 17 effectively divides the signal received from divider 15 by sixteen, divider 15 should be programmed to divide by ten.

As is well known to those skilled in the art, four bit counter 17 produces a four bit number from zero (0000) to 15 (1111) for each clock signal received from divider 15. Four bit counter 17 thus counts through a complete cycle from 0 to 15 for every sixteen clock cycles received from divider 15. Those skilled in the art will recognize that although a four bit counter is disclosed, counters of other sizes may be used according to the teachings of this disclosure.

Circuit 11 includes for each pulse width modulated output, an output module. In the embodiment shown in FIG. 1, there are four output modules 21a-21d. Output module 21a is shown in detail and output modules 21b-21d are shown generally. It should be understood that each of output modules 21b-21d is structurally the same as output module 21a.

Output module 21a includes a first digital comparator 23 and a second digital comparator 25. First digital comparator 23 includes a first input 27 that is connected to four wire bus 19. First digital comparator 23 includes a second input 29 that is connected to a four bit compare register 31. Compare register 31 is programmable to hold a four bit number from 0 (0000) to 15 (1111). Whenever the four bit number held in compare register 31 is equal to the number received from four bit counter 17 on bus 19 at first input 27, digital comparator 23 produces a logical high at its output 33. Whenever the number received at first input 27 is not equal to the value held in compare register 31, a logical low is produced at output 33.

Similarly, second digital comparator 25 includes a first input 35 that is connected to four wire bus 19 and a second input 37 that is connected to a four bit compare register 39. Whenever the values at first input 35 and second input 37 are equal, second digital comparator 25 produces a logical high signal at its output 41.

Output module 21a includes a J-K flip flop 43, such as a 54HC73 or 74HC73 industry standard J-K flip flop. J-K flip flop 43 includes a J input 45 that is connected to output 33 of first digital comparator 23, and a K input 47 that is connected to output 41 of second digital comparator 25. J-K flip flop 43 also includes a clock input 49 that receives clock signals from divider 15.

As is well known to those skilled in the art, J-K flip flop 43 produces a logical high signal at its output 51 on the next cycle following receipt of a high value at J input 45 and a low value at K input 47 in coincidence with a rising clock signal at clock input 49. Output 51 stays high until it receives a logical low value at J input 45 and a logical high value at K input 47 in coincidence with a rising clock signal at input 49.

From the foregoing, it will be understood that output module 21a produces a pulse width modulated output (PWM1) that is programmable to be high or low based upon the values held in compare registers 31 and 39. Similarly, each of output modules 21b-21d produce outputs PWM2-PWM4, respectively, that are high and low based upon the values held in their respective compare registers. Thus, each of output modules 21a-21d can be programmed to produce independent pulse width modulated outputs synchronized to the frequency of four bit counter 17 with independently selectable duty cycles and phase shifts.

Figure 4:
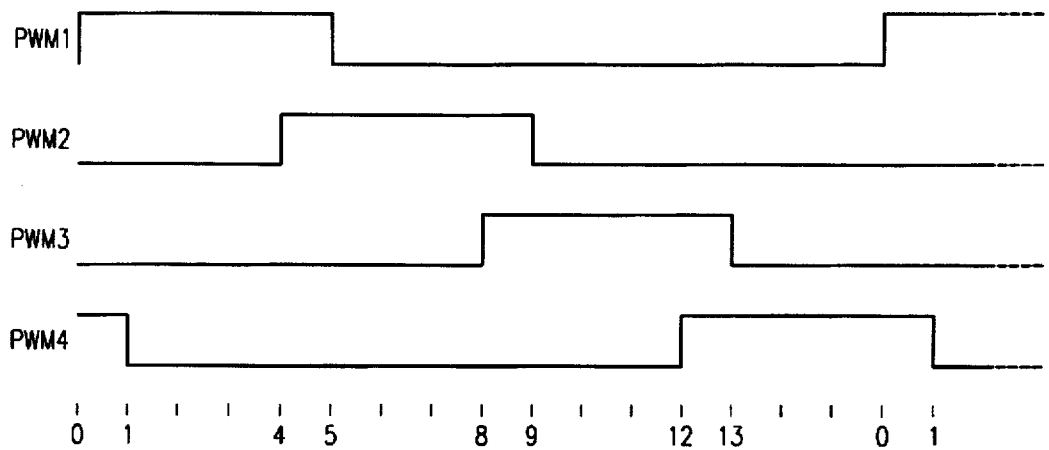
FIG. 4 is a timing diagram illustrating an example of the operation of the synchronization circuit of the present invention.

For example, as shown in FIG. 4, each of output modules 21a-21d is programmed to produce an output PWM1-PWM4 respectively, each having a duty cycle of ⁵⁄₁₆ths and phase shifted 90° with respect to each other. According to the example of FIG. 4, PWM1 goes high at 0 (0000) and low at 5 (0101). Similarly, PWM2 is programmed to go high at 4 (0100) and low at 9 (1001). It will be observed in FIG. 5 that none of outputs PWM1-PWM4 go high or low at the same time. Accordingly, noise due to current changes is minimized.

Figure 5:
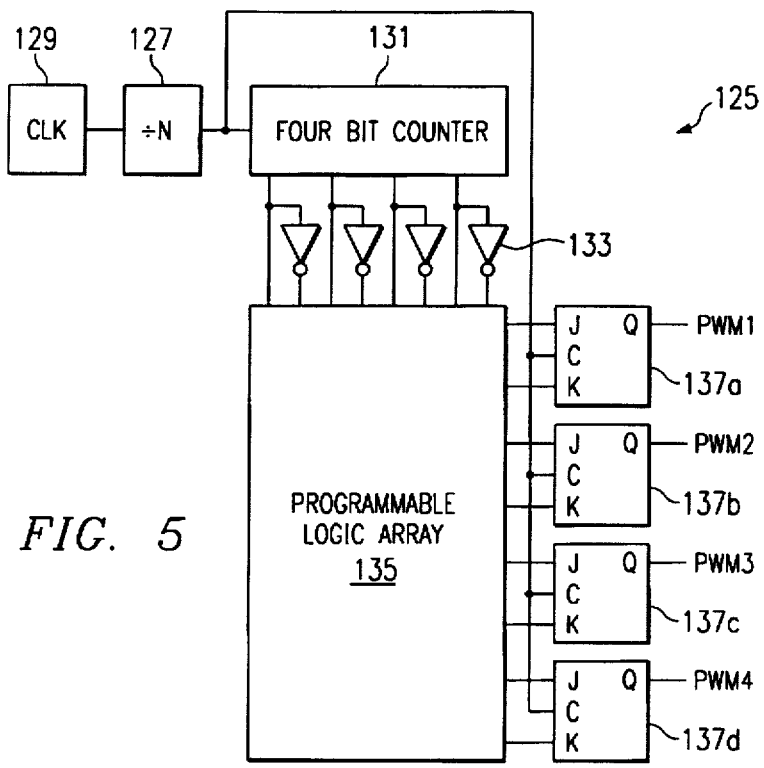
FIG. 5 is a block diagram of yet a further alternative embodiment of the synchronization circuit of the present invention.

Those skilled in the art will recognize that although in the example of FIG. 5 the outputs are all of the same duty cycle and phase shift, the circuit is programmable such that the outputs may have unequal duty cycles or phase shifts. For example, the outputs may be programmed to be high around a center point. More specifically, a three-output system may be programmed such that the outputs are high symmetrically around 8 (1000) in the cycle. Thus, the first output could go high at 6 (0110) and low at 10 (1010), for a duty cycle of ¼. The second output could go high at 4 (0100) and low at 12 (1100), for a duty cycle of ½. Finally, the third output could go high at 2 (0010) and low at 14 (1110), for a duty cycle of ¾.

From the foregoing, those skilled in the art will recognize that by placing appropriate values in compare registers, including compare registers 31 and 39, output modules 21a-21d can be programmed to output pulse width modulated signals of any duty cycle and phase within the frequency determined by divider 15 and four bit counter 17. Additional flexibility is achieved in the embodiment of FIG. 1 by the inclusion of a third digital comparator 51. Third digital comparator 51 includes a first input 53 that is connected to four wire bus 19 and a second input 55 that is connected to a compare register 57. The output 59 of third compare register 51 is connected to a reset pin 61 of four bit counter 17. Accordingly, by inserting an appropriate value into compare register 57, the frequency of circuit 11 can be changed. For example, by inserting the value 8 (1000) into register 57, the frequency of circuit 11 is doubled. In the event four bit counter is reset at 8 (1000) the compare registers of output modules 21a–21d would have to be reprogrammed to hold values between 1 and 7.

Figure 2:
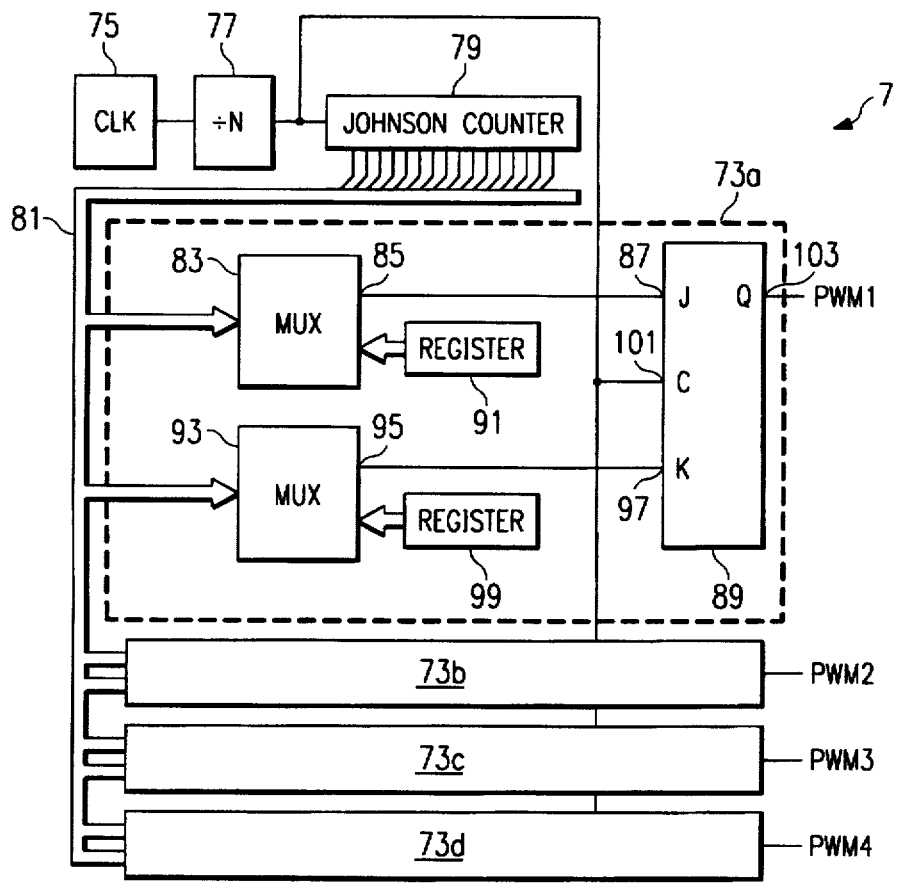
FIG. 2 is a block diagram of an alternative embodiment of the synchronization circuit of the present invention.

Referring now to FIG. 2, there is shown an alternative embodiment of the synchronization circuit of the present invention, which is designated generally by the number 71. Synchronization circuit 71 again is adapted to produce four independently programmable outputs PWM1–PWM4 and it includes four output modules 73a–73d. Again, output module 73a is shown in detail and output modules 73b–73d are structurally the same as output module 73a.

A clock signal 75 is received at a divider 77 that is connected to the input of a Johnson counter 79. Johnson counter 79 has 16 outputs that are connected to a sixteen wire bus 81. Johnson counter 79 sequentially produces a high value at one of its outputs and a low value at each of its other outputs for each clock signal received from divider 77.

Output module 73a includes a first multiplexer 83 that has sixteen inputs connected to sixteen wire bus 81 and a single output 85 connected to J input 87 of a J-K flip flop 89. A select register 91 is programmable to hold a value between 0 and 15, and the value held in select register 91 determines which of the 16 inputs to first multiplexer 83 is connected to output 85.

Output module 73a also includes a second multiplexer 93 having 16 inputs connected to sixteen wire bus 81 and a single output 95 connected to the K input 97 of J-K flip flop 89. A value held in select register 99 determines which of the 16 inputs to second multiplexer 93 is connected to output 95.

J-K flip flop 89 works in the same way as J-K flip flop 43 of FIG. 1. Thus, when J input 87 receives a high input and K input 97 receives a low input in coincidence with a rising clock signal at clock input 101, a high value is produced at output 103. Similarly, whenever K input 97 receives a high value and J input 87 receives a low value in coincidence with a rising clock signal at input 101, a low value is produced at output 103. Accordingly, the embodiment of FIG. 2 produces multiple independently programmable pulse width modulated signals each having a duty cycle and phase shift determined by the values placed in select registers, such as registers 91 and 99, and a frequency determined by divider 77 and Johnson counter 79.

Figure 3:
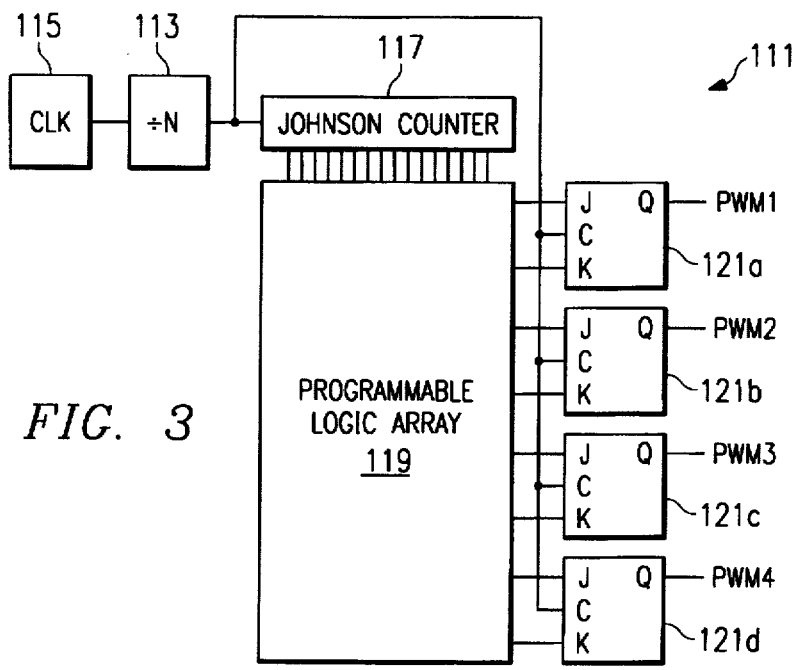
FIG. 3 is a block diagram of a further alternative embodiment of the synchronization circuit of the present invention.

Referring now to FIG. 3, a further alternative embodiment of the synchronization circuit of the present invention is designated generally by the numeral 111. Circuit 111 includes a divider 113 that receives a signal from clock 115 and sends a clock output signal to the input of a Johnson counter 117. Again, Johnson counter 117 has 16 outputs that are connected to a 16×16 programmable logic array 119. Selected ones of the 16 outputs of programmable logic array 119 are connected to the inputs of 4 J-K flip flops 121a–121d. Programmable logic array 119 is programmable to connect a selected input to a selected output. Accordingly, the outputs PWM1–PWM4 of J-K flip flops 121a–121d, respectively are independently programmable with respect to duty cycle and phase shift.

Referring now to FIG. 5, yet a further alternative embodiment of the synchronization circuit of the present invention is designated generally by the numeral 125. Circuit 125 includes a divider 127 that receives a signal from clock 129 and sends a clock output signal to the input of a four bit counter 131. Each of the outputs of four bit counter 131 is branched and includes an inverter 133. Accordingly, four bit counter 131 effectively has eight outputs, and with each clock signal received from divider 127, four bit counter 131 produces an eight bit number.

The eight outputs of four bit counter 131 are connected to the inputs of an 8×8 programmable logic array 135, such as a PAL16R8. The eight outputs of programmable logic array 135 are connected to the inputs of four J-K flip flops 137a–137d. Programmable logic array 135 is programmable to produce a high output at each of its outputs in response to receipt of particular numbers at its inputs. Accordingly, the outputs PWM1–PWM4 of J-K flip flops 137a–137d, respectively, are independently programmable with respect to duty cycle and phase shift.

From the foregoing, those skilled in the art will recognize that the circuit of the present invention is well adapted to produce multiple pulse width modulate outputs based on the same frequency and having user selectable duty cycles and phase shifts. Although the invention is disclosed with reference to preferred embodiments, the disclosed embodiments are intended to illustrate the invention and not to limit it. Different size counters may be used, and different numbers of outputs may be provided, all as would be apparent to those skilled in the art, given the benefit of this disclosure.

What is claimed is:

1. A synchronization circuit for producing multiple pulse width modulated outputs, which comprises:

means for producing a clock signal, said clock signal comprising a plurality of clock pulses;

a counter for counting said clock pulses and outputting count values, said counter including a reset input;

a plurality of logic devices, including one logic device for each pulse width modulated output, each of said logic devices including a first input, a second input, and a clock input connected to receive said clock signal, each of said logic devices producing logical high output in response to a logical high at said first input in coincidence with a clock pulse at said clock input, and each of said logic devices producing logical low output in response to a logical high at said second input in coincidence with a clock pulse at said clock input;

first programmable means operably connected to said counter for selectively applying logical high and low signals to said first and second inputs of each of said logic devices; and, second programmable means operably connected to receive said count values from said counter for selectively applying a reset signal to said reset input of said counter.

2. The synchronization circuit as claimed in claim 1, wherein said first programmable means for selectively applying logical high and low signals to said first and second inputs of each of said logic devices comprises:

a first digital comparator connected to each first input of each logic device, each of said first digital comparators connected to receive said count values from said counter;

a second digital comparator connected to each second input of each logic device, each of said second digital comparators connected to receive said count values from said counter;

a first compare register connected to each of said first digital comparators, each of said first compare registers holding a programmable value; and a second compare register connected to each of said second digital comparators, each of said second compare registers holding a programmable value;

wherein, whenever said count values equal said programmable value in one of said compare registers, the digital comparator connected to said one compare register produces a logical high output.

3. The synchronization circuit as claimed in claim 2, wherein said second programmable means includes:

a third digital comparator having an output connected to said reset input of said counter, said third digital comparator being connected to receive said count values from said counter; and, a third compare register connected to said third digital comparator, said third compare register holding a programmable value;

wherein, whenever said count values equal the programmable value in said third compare register, the third digital comparator produces a logical high output to reset said counter.

4. The synchronization circuit as claimed in claim 1, wherein said logic devices comprise a flip flop.

5. A synchronization circuit for producing multiple pulse width modulated outputs, which comprises:

means for producing a clock signal, said clock signal comprising a plurality of clock pulses;

a counter receiving said clock signal and producing a cyclic output having a user determinable frequency, said counter including a reset input;

a plurality of logic devices, including one logic device for each pulse width modulated output, wherein each logic device includes a first input, a second input, and a clock input input, each of said logic devices turning on in response to a logical high at said first input in coincidence with a clock pulse at said clock input, and each of said logic devices turning off in response to a logical high at said second input in coincidence with a clock pulse at said clock input;

means operably connected to said counter for selectively turning each of said logic devices on and off once at user selectable times during each cycle of said counter; and, means selectively connected to receive said cyclic output from said counter for applying a reset signal to said reset input of said counter.

6. The synchronization circuit as claimed in claim 5, wherein said means for selectively turning each of said logic devices on and off once at user selectable times during each cycle of said counter comprises:

a first digital comparator connected to each first input of each logic device, each of said first digital comparators connected to receive said count values from said counter;

a second digital comparator connected to each second input of each logic device, each of said second digital comparators connected to receive said count values from said counter;

a first compare register connected to each of said first digital comparators, each of said first compare registers holding a programmable value; and a second compare register connected to each of said second digital comparators, each of said second compare registers holding a programmable value;

wherein, whenever said count values equal said programmable value in one of said compare registers, the digital comparator connected to said one compare register produces a logical high output.

7. The synchronization circuit as claimed in claim 6, wherein said means for selectively applying said reset signal to said reset input of said counter includes:

a third digital comparator having an output connected to said reset input of said counter, said third digital comparator being connected to receive said count values from said counter; and, a third compare register connected to said third digital comparator, said third compare register holding a programmable value;

wherein, whenever said count values equals the programmable value in said third compare register, the third digital comparator produces a logical high output to reset said counter.

8. A synchronization circuit for producing multiple pulse width modulated outputs, which comprises:

means for producing a clock signal, said clock signal comprising a plurality of clock pulses;

a counter for counting said clock pulses and outputting count values, said counter including a reset input;

a plurality of logic devices, including one logic device for each pulse width modulated output, each of said logic devices including a first input, a second input, and a clock input connected to receive said clock signal, each of said logic devices producing logical high output in response to a logical high at said first input in coincidence with said clock signal at said clock input, and each of said logic devices producing logical low output in response to a logical high at said second input in coincidence with said clock signal at said clock input;

a first digital comparator connected to each first input of each logic device, each of said first digital comparators connected to receive said count values from said counter;

a second digital comparator connected to each second input of each logic device, each of said second digital comparators connected to receive said count values from said counter;

a first compare register connected to each of said first digital comparators, each of said first compare registers holding a programmable value; and a second compare register connected to each of said second digital comparators, each of said second compare registers holding a programmable value, wherein whenever said count values equal said programmable value in one of said compare registers, the digital comparator associated with said one compare register produces a logical high output;

a third digital comparator having an output connected to said reset input of said counter, said third digital comparator being connected to receive said count values from said counter; and, a third compare register connected to said third digital comparator, said third compare register holding a programmable value, wherein whenever said count values equal the programmable value in said third compare register, the third digital comparator produces a logical high output to reset said counter.

9. A synchronization circuit for producing multiple pulse width modulated outputs, which comprises:

means for producing a clock signal, said clock signal comprising a plurality of clock pulses;

a counter for counting said clock pulses and outputting a count value, said counter including a reset input;

a plurality of logic devices, including one logic device for each pulse width modulated output, each of said logic devices including a first input, a second input, and a clock input connected to receive said clock signal, each of said logic devices producing a first output in response to a first logic level at said first input in coincidence with said clock pulses at said clock input, and each of said logic devices producing a second output in response to a first logic level at said second input in coincidence with said clock pulses at said clock input;

first programmable means operably connected to said counter for selectively applying first and second logic level signals to said first and second inputs of each of said logic devices; and, second programmable means operably connected to receive said count value from said counter for selectively applying a reset signal to said reset input of said counter.

10. The synchronization circuit as claimed in claim 9, wherein said first programmable means for selectively applying said first and second logic level signals to said first and second inputs of each of said logic devices comprises:

a first digital comparator connected to each first input of each logic device, each of said first digital comparators connected to receive said count value from said counter;

a second digital comparator connected to each second input of each logic device, each of said second digital comparators connected to receive said count value from said counter;

a first compare register connected to each of said first digital comparators, each of said first compare registers holding a programmable value; and a second compare register connected to each of said second digital comparators, each of said second compare registers holding a programmable value;

wherein, whenever said count value equals said programmable value in one of said compare registers, the digital comparator connected to said one compare register produces a first logic level output.

11. The synchronization circuit as claimed in claim 10, wherein said second programmable means includes:

a third digital comparator having an output connected to said reset input of said counter, said third digital comparator being connected to receive said count value from said counter; and, a third compare register connected to said third digital comparator, said third compare register holding a programmable value;

wherein, whenever said count value equals the programmable value in said third compare register, the third digital comparator produces a logical high output to reset said counter.

12. The synchronization circuit as claimed in claim 9, wherein said logic device comprises a flip flop.

13. A synchronization circuit for producing multiple pulse width modulated outputs, which comprises:

means for producing a clock signal, said clock signal comprising a plurality of clock pulses;

a counter receiving said clock signal and producing a cyclic output having a user determinable frequency, said counter including a reset input;

a plurality of logic devices, including one logic device for each pulse width modulated output, wherein each logic device includes a first input, a second input, and a clock input, each of said logic devices turning on in response to a first logic level at said first input in coincidence with said clock pulses at said clock input, and each of said logic devices turning off in response to a first logic level at said second input in coincidence with said clock pulses at said clock input;

means operably connected to said counter for selectively turning each of said logic devices on and off once at user selectable times during each cycle of said counter; and, means selectively connected to receive said cyclic output from said counter for applying a reset signal to said reset input of said counter.

14. The synchronization circuit as claimed in claim 13, wherein said means for selectively turning each of said logic devices on and off once at user selectable times during each cycle of said counter comprises:

a first digital comparator connected to each first input of each logic device, each of said first digital comparators connected to receive count values from said counter;

a second digital comparator connected to each second input of each logic device, each of said second digital comparators connected to receive said count values from said counter;

a first compare register connected to each of said first digital comparators, each of said first compare registers holding a programmable value; and a second compare register connected to each of said second digital comparators, each of said second compare registers holding a programmable value;

wherein, whenever said count values equal said programmable value in one of said compare registers, the digital comparator connected to said one compare register produces a first logic level output.

15. The synchronization circuit as claimed in claim 14, wherein said means for selectively applying said reset signal to said reset input of said counter includes:

a third digital comparator having an output connected to said reset input of said counter, said third digital comparator being connected to receive said count values from said counter; and, a third compare register connected to said third digital comparator, said third compare register holding a programmable value;

wherein, whenever said count values equal the programmable value in said third compare register, the third digital comparator produces a first logic level output to reset said counter.

16. A synchronization circuit for producing multiple pulse width modulated outputs, which comprises:

means for producing a clock signal, said clock signal comprising a plurality of clock pulses;

a counter for outputting a clock pulses and outputting a count value, said counter including a reset input;

a plurality of logic devices, including one logic device for each pulse width modulated output, each of said logic devices including a first input, a second input, and a clock input connected to receive said clock signal, each of said logic devices producing a first output in response to a first logic level at said first input in coincidence with said clock signal at said clock input, and each of said logic devices producing a second output in response to a first logic level at said second input in coincidence with said clock pulses at said clock input;

a first digital comparator connected to each first input of each logic device, each of said first digital comparators connected to receive said count value from said counter;

a second digital comparator connected to each second input of each logic device, each of said second digital comparators connected to receive said count value from said counter;

a first compare register connected to each of said first digital comparators, each of said first compare registers holding a programmable value; and a second compare register connected to each of said second digital comparators, each of said second compare registers holding a programmable value, wherein whenever said count value equals said programmable value in one of said compare registers, the digital comparator associated with said one compare register produces a a first logic level output;

a third digital comparator having an output connected to said reset input of said counter, said third digital comparator being connected to receive said count value from said counter; and, a third compare register connected to said third digital comparator, said third compare register holding a programmable value, wherein whenever said count value equals the programmable value in said third compare register, the third digital comparator produces a first logic level output to reset said counter.

\* \* \* \* \*